(12) United States Patent
Stansell

(10) Patent No.: US 6,271,702 B1
(45) Date of Patent: Aug. 7, 2001

(54) CLOCK CIRCUIT FOR GENERATING A DELAY

(75) Inventor: Galen E. Stansell, Kirkland, WA (US)

(73) Assignee: Cypress Semiconductor Corp., San Jose, CA (US)

( * ) Notice: Subject to any disclaimer, the term of this patent is extended or adjusted under 35 U.S.C. 154(b) by 0 days.

(21) Appl. No.: 09/105,329

(22) Filed: Jun. 25, 1998

(51) Int. Cl.[7] ................................. G06F 1/04; H03K 3/00
(52) U.S. Cl. ......................... 327/295; 327/115; 327/117; 327/269; 327/400
(58) Field of Search .................................. 327/113, 115, 327/117, 291, 295, 269, 400

(56) References Cited

U.S. PATENT DOCUMENTS 5,365,119 * 11/1994 Kivari ................................... 327/115

* cited by examiner

Primary Examiner—Terry D. Cunningham
Assistant Examiner—Quan Tra
(74) Attorney, Agent, or Firm—Christopher P. Maiorana, P.C.

(57) ABSTRACT

A delay generation circuit comprising (i) a circuit configured to generate a reference clock signal having a period, (ii) a divide circuit and (iii) an output circuit. The divide circuit may be configured to generate a first divided clock signal and a second divided clock signal in response to said reference clock signal. The output circuit may be configured to generate (i) a first output clock signal and (ii) a second output clock signal in response to (i) the first and second divided clock signals and (ii) the reference clock signal. The second output clock signal may have a delay with respect to the first output clock signal. The delay may be (i) a multiple of or (ii) a fraction of the period of the reference clock signal.

20 Claims, 3 Drawing Sheets

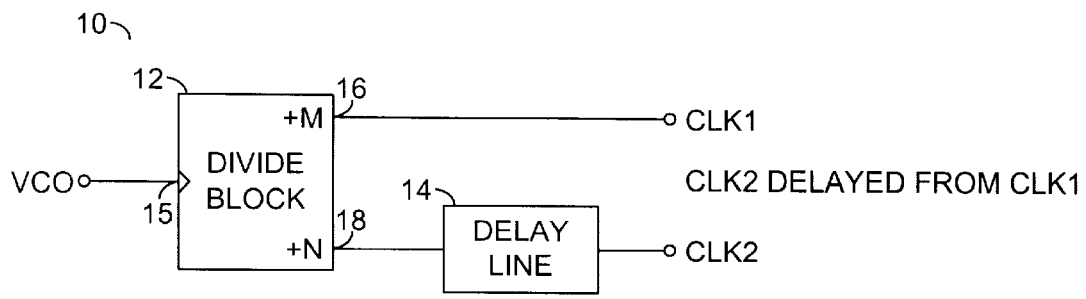
(CONVENTIONAL)
FIG. 1
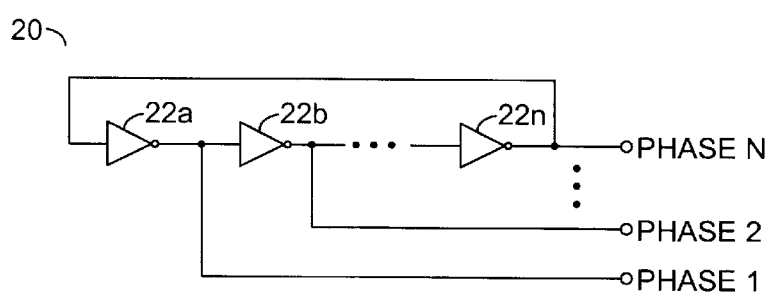
(CONVENTIONAL)
FIG. 2

ΔT=1/2 PERIOD OF REFCLK

CLOCK CIRCUIT FOR GENERATING A DELAY

FIELD OF THE INVENTION

The present invention relates to delay circuits generally and, more particularly, to a circuit and method for generating an output delay in response to a clock.

BACKGROUND OF THE INVIENTION

Delay elements vary with process, voltage and temperature variations. Previous solutions for generating delays require that delays be tested to ensure the desired specification parameters have been met. An example of such a conventional delay generation is shown in the circuit 10 of FIG. 1. The circuit 10 generally comprises a divide block 12 and a delay line 14. The divide block 12 has an input 15 that may receive a periodic frequency from a voltage control oscillator (VCO), not shown. The divide block 12 has a first output 16 and a second output 18. The output 16 generates a clock signal CLK1 that may be an integer divided clock of the signal receive at the input 15. The output 18 presents a signal CLK2 that may be an integer divided clock of the signal received at the input 15. The delay line 14 delays the signal presented at the output 18 to present a signal CLK2. The signal CLK2 is delayed from the signal CLK1 by an amount defined by the delay line 14. The circuit 10 suffers from a variety of problems including variations caused by process, voltage and temperature variations. Additionally, the circuit 10 is difficult to model, may be sensitive to load variations and may introduce jitter. The introduction of jitter is often the result of slow-edge transitions and delay modulation within delay line 14 (i.e., the delay is a function of the voltage (f(V)).

Referring to FIG. 2, a circuit 20 illustrates a simplified view of a second conventional approach for delay generation. A circuit 20 comprises a number of delay elements 22a–22n. A number of outputs (i.e., phase1, phase2 and phaseN) represent internal taps from a VCO. By tapping the VCO ring elements, the overall VCO layout may be complicated, which may be particularly true in a design application where the internal design of the VCO is not convenient to alter. Additionally, by tapping the ring elements of the VCO, each element has an additional load, which may affect the ultimate maximum frequency of oscillation of the VCO. Additionally, it may be difficult to implement synchronous divides from different clock phases of a VCO.

SUMMARY OF THE INVENTION

The present invention concerns a delay generation circuit comprising (i) a circuit configured to generate a reference clock signal having a period, (ii) a divide circuit and (iii) an output circuit. The divide circuit may be configured to generate a first divided clock signal and a second divided clock signal in response to said reference clock signal. The output circuit may be configured to generate (i) a first output clock signal and (ii) a second output clock signal in response to (i) the first and second divided clock signals and (ii) the reference clock signal. The second output clock signal may have a delay with respect to the first output clock signal. The delay may be (i) a multiple of or (ii) a fraction of the period of the reference clock signal.

The objects, features and advantages of the present invention include providing a delay from a known/time invariable frequency that may (i) be simple to implement and (ii) avoid introducing load jitter when compared to a conventional delay.

BRIEF DESCRIPTION OF THE DRAWINGS

These and other objects, features and advantages of the present invention will be apparent from the following detailed description and the appended claims and drawings in which:

FIG. 1 is a block diagram of a conventional delay;

FIG. 2 is a block diagram of a second conventional delay;

DETAILED DESCRIPTION OF THE PREFERRED EMBODIMENTS

Figure 3:
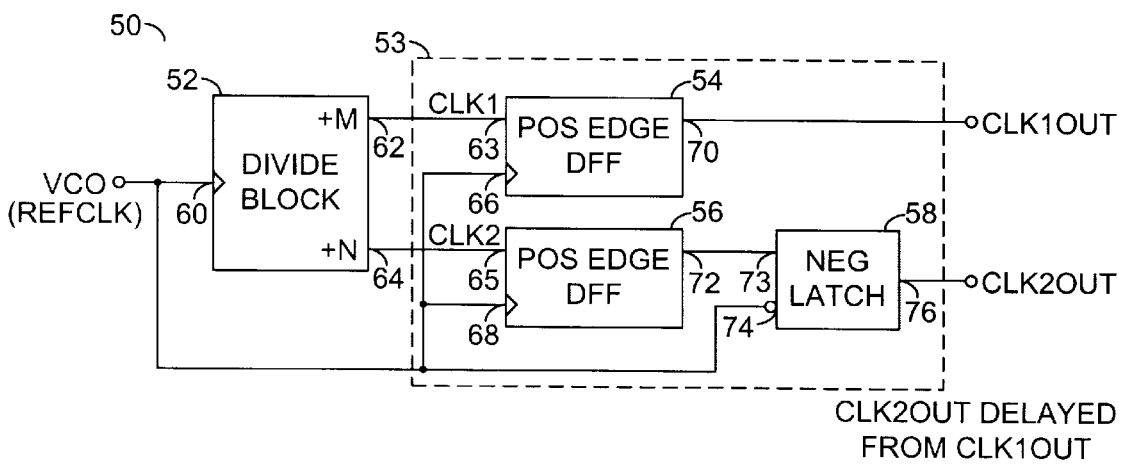
FIG. 3 is a block diagram of a preferred embodiment of the present invention.

Referring to FIG. 3, a block diagram of a circuit 50 is shown in accordance with a preferred embodiment of the present invention. The circuit 50 generally comprises a divide block (or circuit 52) and an output block (or circuit) 53. The output circuit 53 generally comprises a device 54, a device 56 and a device 58. The device 54 may be implemented, in one example, as a (1) positive or (2) negative edge-triggered D-type flip-flop. Similarly, the device 56 may be implemented, in one example, as (1) a positive or (2) a negative edge-triggered D-type flip-flop. The device 54 and the device 56 generally should trigger from the same edge (i.e., both should be positive edge-triggered or both should be negative edge-triggered). The device 58 may be implemented, in one example, as a negative latch (for case (1) above) or a positive latch (for case (2) above).

The divide block 52 generally comprises an input 60 that may receive a known and generally time invariable frequency (e.g., REFCLK). In one example, a voltage controlled oscillator (VCO) may be used to generate the known and time invariable frequency signal REFCLK that may be presented to the input 60. However, other sources may be used to generate the reference frequency in order to meet the design criteria of a particular application. The divide block 52 may also comprise an output 62 that may present a signal (e.g., CLK1) to an input 63 of the flip-flop 54 and an output 64 that may present a signal (e.g., CLK2) to an input 65 of the flip-flop 56. The output 62 may present the signal CLK1 that may be a divided clock signal based on the signal REFCLK received at the input 60. The output 64 may present the signal CLK2 that may be a divided clock based on the signal REFCLK received at the input 60. In general, the signal CLK1 is an integer divided clock that is different than the signal CLK2, which may be another integer divided clock. In one example, the signal CLK1 may have the same frequency as the signal CLK2. In another example, the signal CLK1 may have a different frequency than the signal CLK2. The flip-flop 54 may have an input 66 that may receive the reference signal REFCLK. Similarly, the flip-flop 56 may have an input 68 that may receive the reference signal REFCLK. The flip-flop 54 may also comprise an output 70 that may present an output signal (e.g., CLK1OUT). The flip-flop 56 may have an output 72 that may present a signal to an input 73 of the negative latch 58. The negative latch 58 may also have an input 74 that may receive a complement of the reference signal REFCLK. The negative latch 58 may have an to output 76 that may present a second output signal (e.g., CLK2OUT).

In the example shown where the signal CLK1OUT is generated by the flip-flop 54 and the signal CLK2OUT is generated by the flip-flop 56 and the latch 58, the delay between the signal CLK1OUT and the signal CLK2OUT may be a fraction of, or a multiple of, the period of the signal REFCLK, depending on the number of latches 58 implemented after the output 72. More specifically, the particular amount of delay presented may be adjusted by adding additional latches or flip-flops to the signal CLK2OUT. However, the device 54 and the device 56 must generally be implemented in each of the paths presenting the signal CLK1OUT and the signal CLK2OUT, to provide a resynchronization of the signal CLK1 and the signal CLK2.

The latch 58 generally provides a delay equal to one-half of the period of the signal REFCLK received at the input 60. If the latch 58 is replaced with a flip-flop, the delay may be equal to a full period of the signal REFCLK received at the input 60. If the latch 58 is supplemented with an additional flip-flop (not shown), the delay may be equal to 1½ of the period of the signal REFCLK. In general, the delay presented may be equal to the period of the signal REFCLK times the number of additional flip-flops, plus ½ times the period of the signal REFCLK times the number of latches. To adjust the delay in finer increments than the period of the signal REFCLK, the frequency of oscillation of the signal REFCLK may be adjusted.

Figure 4:
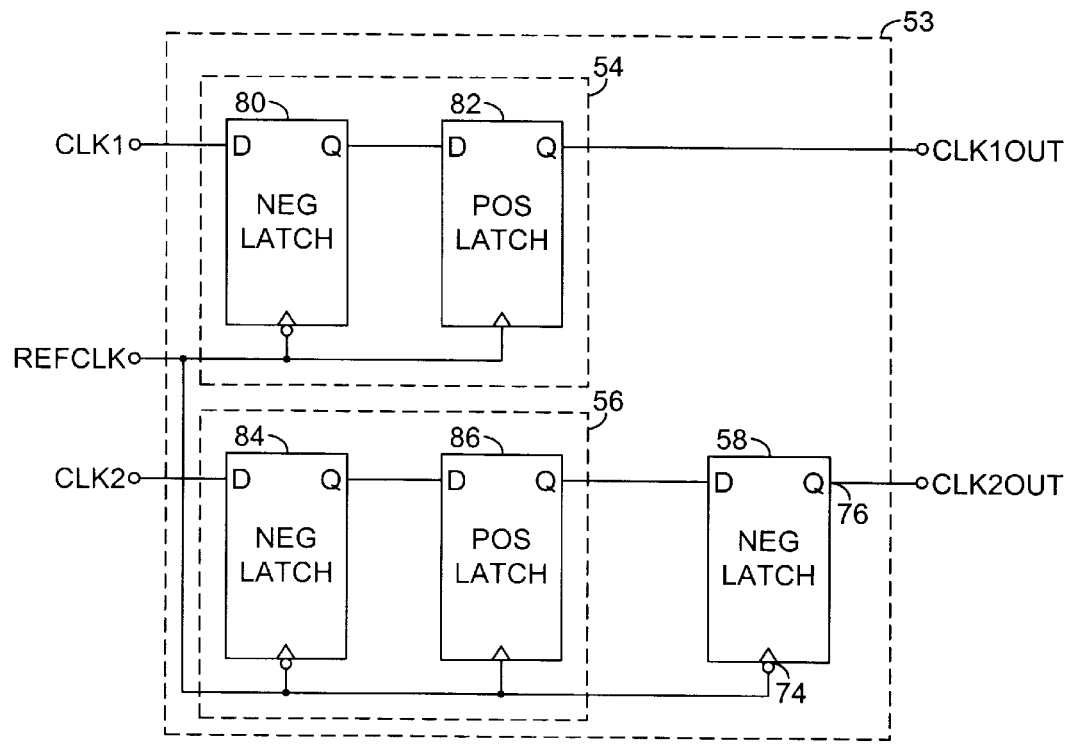
FIG. 4 is a more detailed diagram of the output section of the circuit of FIG. 3.

Referring to FIG. 4, a more detailed diagram of the output circuit 53 is shown. The device 54 is shown implemented as a negative latch 80 and a positive latch 82. Similarly, the device 56 is shown implemented as a negative latch 84 and a positive latch 86. Alternatively, the device 54 and the device 56 may be implemented as one negative latch or one positive latch, provided a similarly functioning device is used to implement each device 54 and 56, respectively.

Figure 5:
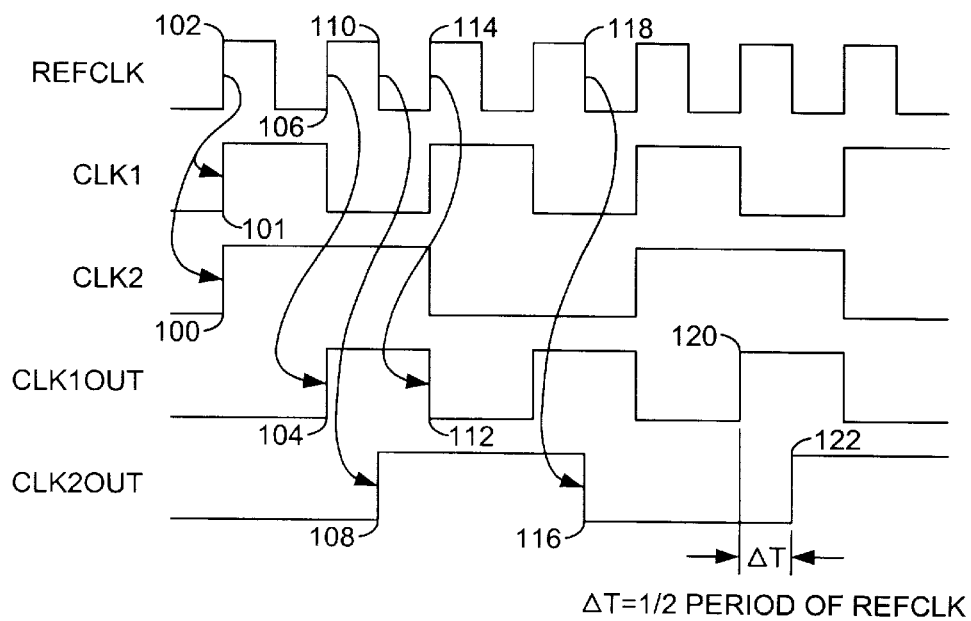
FIG. 5 is a timing diagram of the various waveforms of the circuit of FIG. 3.

Referring to FIG. 5, a timing diagram of an example of the circuit 50 is shown. The timing diagram illustrates the reference clock signal REFCLK, the clock signal CLK2, the clock signal CLK1, the clock signal CLK2OUT and the clock signal CLK1OUT. The example of FIG. 5 illustrates the signal CLK2 being divided by 2 with respect to the signal REFCLK and the signal CLK1 being divided by 4 with respect to the signal REFCLK. The signal CLK2 has a positive transition 100 that generally responds to a positive transition 102 of the signal REFCLK. The signal CLK1 has a positive transition 101 that may respond to the positive transition 102 of the signal REFCLK. The signal CLK1OUT generally has a positive transition 104 that may respond to a positive transition 106 of the signal REFCLK. The signal CLK2OUT generally has a positive transition 108 that may respond to a negative transition 110 of the signal REFCLK. The signal CLK1OUT generally has a negative transition 112 that may respond to a positive transition 114 of the signal REFCLK. The signal CLK2OUT generally has a negative transition 116 that may respond to a negative transition 118 of the signal REFCLK. The signal CLK1OUT generally has a positive transition 120 that is shown separated by a time ΔT when compared to a positive transition 122 of the signal CLK2OUT. The time ΔT generally represents the delay presented by the circuit 50. In an example where the signal CLK2OUT and the signal CLK1OUT have other integer divisions when compared to the signal REFCLK, every positive transition of each of the output signal CLK1OUT and CLK2OUT may not have the desired delay. However, certain design applications may be implemented with such an arrangement. For example, if the signal CLK1 is a divide by 2 signal and the signal CLK2 is a divide by 3 signal, every second positive transition of the signal CLK2OUT may have the desired delay.

Figure 6:
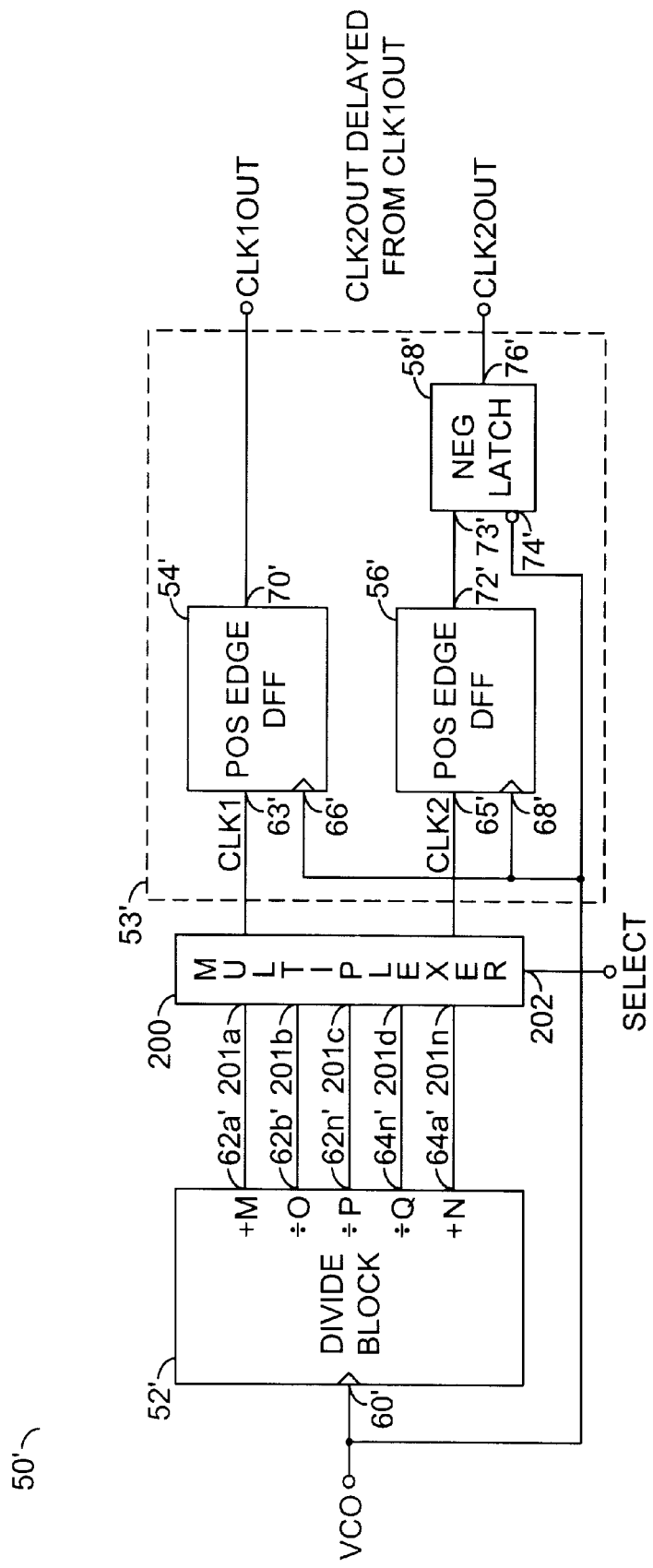
FIG. 6 is an alternate implementation of the present invention.

Referring to FIG. 6, a circuit 50' is shown illustrating an alternate implementation of the present invention. The circuit 50' further comprises a multiplexer 200. The multiplexer 200 may have a number of inputs 201a–201n that may each receive a divider clock signal from one of the outputs 62a'–62n' and 64a'–64n' and an input 202 that may receive a select signal. The select signal presented to the input 202 may select which input 201a–201n is presented to each of the inputs 63' and 65'. The multiplexer 200 may provide conditioning of the signal CLK1 and the signal CLK2 prior to the presentation to the output block 53'.

While the invention has been particularly shown and described with reference to the preferred embodiments thereof, it will be understood by those skilled in the art that various changes in form and details may be made without departing from the spirit and scope of the invention.

What is claimed is:

1. A circuit comprising:
   a circuit configured to generate a reference clock signal having a period;
   a divide circuit configured to generate a first divided clock signal and a second divided clock signal in response to said reference clock signal; and
   an output circuit configured to generate (i) a first output clock signal in response to said first divided clock signal and said reference clock and (ii) a second output clock signal in response to said second divided clock signal, said reference clock signal and a digital complement of said reference clock signal, wherein said second output clock signal has a delay with respect to said first output clock signal and said delay is (i) a multiple of or (ii) a fraction of the period of said reference clock signal.

2. The circuit according to claim 1, wherein said output circuit comprises a latch.

3. The circuit according to claim 2, wherein said latch comprises either a negative edge-triggered latch or a positive edge-triggered latch.

4. The circuit according to claim 2, wherein said first divided clock signal oscillates at a first frequency and said second divided clock signal oscillates at a second frequency, wherein first and second frequencies are the same.

5. The circuit according to claim 2, wherein said first divided clock signal oscillates at a first frequency and said second divided clock signal oscillates at a second frequency, wherein first and second frequencies are the different.

6. The circuit according to claim 2, wherein said output circuit further comprises one or more flip-flops.

7. The circuit according to claim 2, wherein said output circuit further comprises one or more flip-flops and a latch.

8. The circuit according to claim 5, wherein said latch comprises either a negative edge-triggered latch or a positive edge-triggered latch.

9. The circuit according to claim 3, wherein the number of latches determines the amount of said delay.

10. The circuit according to claim 9, wherein the amount of said delay is equal to the number of latches times one-half of the period of said reference clock signal.

11. A circuit comprising:
    means for generating a reference clock signal having a period;
    means for generating a first divided clock signal and a second divided clock signal in response to said reference clock signal; and
    means for generating (i) a first output clock signal in response to said first divided clock signal and said reference clock and (ii) a second output clock signal in response to said second divided clock signal, said reference clock signal and a digital complement of said reference clock signal, wherein said second output clock signal has a delay with respect to said first output clock signal and said delay is (i) a multiple of or (ii) a fraction of the period of said reference clock signal.

12. A method for generating a delay comprising the step of:

(A) generating a reference clock signal having a period;

(B) generating a first divided clock signal and a second divided clock signal in response to said reference clock signal; and (C) generating (i) a first output clock signal in response to said first divided clock signal and said reference clock and (ii) a second output clock signal in response to said second divided clock signal, said reference clock signal and a digital complement of said reference clock signal, wherein said second output clock signal has a delay with respect to said first output clock signal, and said delay is (i) a multiple of or (ii) a fraction of the period of said reference clock signal.

13. The method according to claim 12, wherein said second output signal is generated in response to a latch.

14. The method according to claim 13, wherein said latch comprises a negative edge-triggered latch.

15. The method according to claim 13, wherein said latch comprises a positive edge-triggered latch.

16. The method according to claim 13, wherein said first and second output clock signals are generated in response to one or more flip-flops.

17. The method according to claim 13, wherein said second output clock signal is generated in response to one or more flip-flops and a latch.

18. The method according to claim 17, wherein said latch comprises a negative edge-triggered latch.

19. The method according to claim 17, wherein said latch comprises a positive edge-triggered latch.

20. The method according to claim 13, further comprising one or more latches wherein the delay is equal to the number of latches times one-half the period of said reference clock signal.

* * * * *